United States Patent
Chien

(10) Patent No.: US 6,639,324 B1
(45) Date of Patent: Oct. 28, 2003

(54) FLIP CHIP PACKAGE MODULE AND METHOD OF FORMING THE SAME

(75) Inventor: Ray Chien, Taipei (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 10/253,822

(22) Filed: Sep. 25, 2002

(30) Foreign Application Priority Data

Jul. 9, 2002 (TW) ........................................ 91115241 A

(51) Int. Cl.[7] ........................... H01L 23/48; H01L 23/52
(52) U.S. Cl. ........................ 257/778; 257/700; 257/701; 257/706; 257/707; 257/723
(58) Field of Search ................ 257/675, 700, 257/701, 706, 707, 723

(56) References Cited

U.S. PATENT DOCUMENTS

| | | | | |
|---|---|---|---|---|
| 5,250,843 A | * | 10/1993 | Eichelberger | 257/692 |
| 5,420,460 A | * | 5/1995 | Massingill | 257/668 |
| 5,432,677 A | * | 7/1995 | Mowatt et al. | 257/724 |
| 5,521,435 A | * | 5/1996 | Mizukoshi | 257/698 |
| 5,751,060 A | * | 5/1998 | Laine et al. | 257/702 |
| 5,773,884 A | * | 6/1998 | Andros et al. | 257/707 |
| 5,789,809 A | * | 8/1998 | Joshi | 257/704 |
| 5,886,399 A | * | 3/1999 | Ohsawa et al. | 257/668 |
| 5,898,224 A | * | 4/1999 | Akram | 257/778 |
| 5,929,517 A | * | 7/1999 | Distefano et al. | 257/707 |
| 5,945,741 A | * | 8/1999 | Ohsawa et al. | 257/777 |
| 5,977,633 A | * | 11/1999 | Suzuki et al. | 257/738 |
| 5,990,553 A | * | 11/1999 | Morita et al. | 257/729 |
| 6,140,707 A | * | 10/2000 | Plepys et al. | 257/778 |
| 6,288,900 B1 | * | 9/2001 | Johnson et al. | 361/705 |
| 6,396,148 B1 | * | 5/2002 | Eichelberger et al. | 257/758 |
| 6,404,070 B1 | * | 6/2002 | Higashi et al. | 257/796 |
| 6,483,187 B1 | * | 11/2002 | Chao et al. | 257/712 |
| 6,489,667 B1 | * | 12/2002 | Shim et al. | 257/668 |
| 6,525,429 B1 | * | 2/2003 | Kovac et al. | 257/778 |
| 6,559,536 B1 | * | 5/2003 | Katoh et al. | 257/712 |
| 6,563,212 B2 | * | 5/2003 | Shibamoto et al. | 257/712 |

* cited by examiner

Primary Examiner—Jasmine Clark
(74) Attorney, Agent, or Firm—Troxell Law Office PLLC

(57) ABSTRACT

A flip-chip package module consists of a semiconductor chip, a heat sink plate, a dielectric layer and a metal interconnect layer. The semiconductor chip has a positive side with a plurality of die pads located thereon and a back side for mounting onto the heat sink plate. The dielectric layer is formed by depositing on the surface of the inner heat sink plate and encases the semiconductor chip therein. The metal interconnect layer is formed on the surface of the dielectric layer and includes a plurality of metal conductive wires. Each of the metal conductive wires connects to one of the die pads of the semiconductor chip through a via.

25 Claims, 5 Drawing Sheets

FLIP CHIP PACKAGE MODULE AND METHOD OF FORMING THE SAME

BACKGROUND OF THE INVENTION

1. Field of the Invention

The present invention relates to a flip chip package module and, more particularly, to a flip chip package module with enhanced thermal dissipation and a method of forming the same.

2. Discussion of the Background

Flip chip package is an advanced packaging technique for connecting a semiconductor chip to a substrate. During the packaging process, the semiconductor chip is turned upside down to connect to the metal pads and hence the metal conductive wires of the substrate.

Please refer first to FIG. 1 for the cross-sectional diagram of a flip chip package module in accordance with the prior art. The flip chip package module generally consists of a substrate 10, a semiconductor chip 12, a plurality of bumps 14, an underfill layer 16, and a plurality of solder balls 18.

The substrate 10 is an insulating material with two sides that have respectively a first metal interconnect layer 101 and a second metal interconnect layer 102. The first and the second metal interconnect layers 101 and 102 have respectively a plurality of metal conductive wires locatedtherein, and are electrically connected by means of a plurality of vias 11. The circuit side (positive side) of the semiconductor chip 12 has a plurality of die pads. Under bump metallurgy (UBM) has to be formed on the die pad surface before forming the bumps 14 thereon. The semiconductor chip 12 is bonded by soldering to the first metal interconnect layer 101 of the substrate 10 through the bumps 14 on its surface. Then an underfill layer 16 is formed between the semiconductor chip 12 and the substrate 10 to increase the mechanical bonding strength. In addition, every metal conductive wire on the second metal interconnect layer 102 connects to a solder pad for the purpose of soldering a solder ball 18.

However, the prior art has the following disadvantage:

1. UBM (Under Bump Metallurgy) must be formed on the die pads before applying the bumps for bonding the semiconductor chip onto the first metal interconnect layer of the substrate. The processes of making UBM and the bumps are costly.

2. The substrate in the prior art usually contains muitiple layers (four or six metal interconnect layers). Therefore, the manufacturing process of the conventional substrate is very costly.

3. The probe card for testing electricity of the semocinductor chip adopted for the semoconductor chip with bumps is more expensive.

4. When applying the prior art for packaging the flip chip of multi-chip module (MCM) that has different chip thickness, it is difficult to bond a single heat sink to the MCM package die surfaces, due to the incoplanarity of the die surfaces. As a result, total heat dissipation suffers.

SUMMARY OF THE INVENTION

One object of the present invention is to provide a flip chip package module.

Another object of the present invention relates to a method for forming the flip chip package module.

The flip chip package module disclosed according to the present invention comprises a semicomductor chip, a heat sink plate, a dielectric layer and a metal interconnect layer. The semicomductor chip has a positive side with a plurality of die pads located thereon and a back side directly bonded to the heat sink plate. The dielectric layer is formed on the inner surface of the heat sink plate by depositing dielelctric material(s) and the semicomductor chip is encased therein in the mean time. The surface of the dielectric layer has a metal interconnect layer which consists of a plurality of metal conductive wires. Every metal conductive wire connects electrically to one of the die pads of the semiconductor chip through a via. Furthermore, every metal conductive wire connects to a pad for soldering solder balls or enabling a test probe to perform electric test for the semiconductor chip.

The present invention also discloses a method of forming the flip chip package module. The method comprises the following steps. First, a heat sink plate is provided. Then bond the back side of a semiconductor chip to the heat sink plate. Thereafter, deposit a dielectric layer on the inner surface of the heat sink plate and encase the semiconductor chip therein. Then grind the dielectric layer through a CMP (Chemical Mechanical Planarization) process.

After the planarization process, form a plurality of via holes on the surface of the dielectric layer by laser drilling or dry etching process. Each via hole connect to a die pad located on the positive side of the semiconductor chip. Then form a metal interconnect layer on the surface of the dielectric layer by metal deposition and fill the via holes during the same process to form a plurality of vias. Finally form a plurality of metal conductive wires and pads by performing a photo lithographic process and an etching process.

The foregoing, as well as additional objects, features and advantages of the invention will be more readily apparent from the following detailed descriptions, which proceed with reference to the accompanying drawings.

DESCRIPTION OF THE PREFERRED EMBODIMENTS

Figure 1:
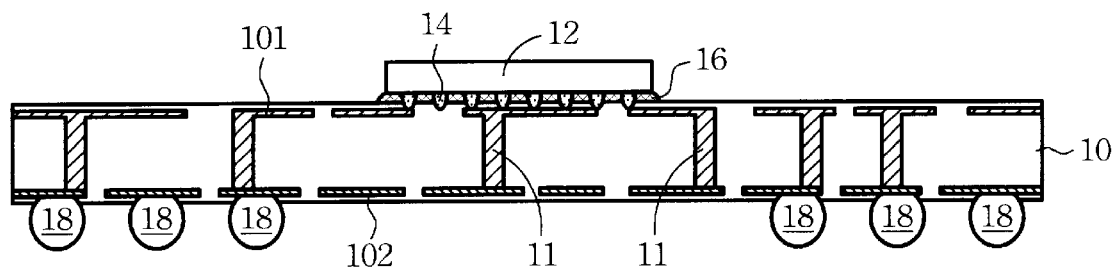
FIG. 1 schematically illustrates the cross-sectional diagram of the flip chip package module in accordance with the prior art.
Figure 2:
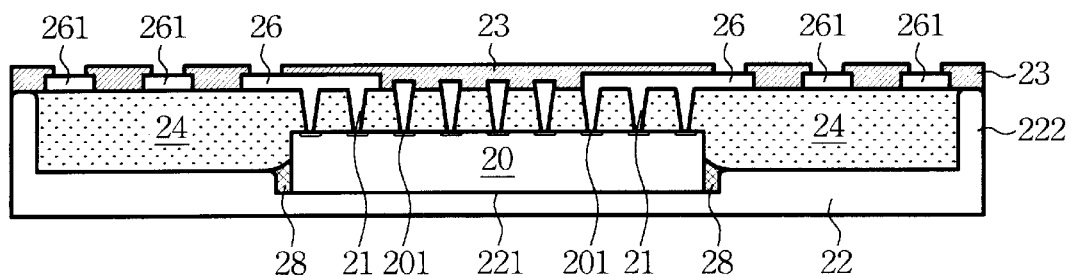
FIG. 2 schematically illustrates the cross-sectional diagram of the flip chip package module in accordance with the first embodiment of the present invention.

Please refer to FIG. 2, which schematically illustrates the cross-sectional diagram of the flip chip package module in accordance with the first embodiment of the present invention. The flip chip package module of the invention comprises a semiconductor chip 20, a heat sink plate 22, a dielectric layer 24 and a metal interconnect layer 26. The semiconductor chip 20 has a positive side which has a plurality of die pads 201 thereon. The inner surface of the heat sink plate 22 has a recessed cavity 221 which is bordered by side walls 222 to reinforce the package module. The back side of the semiconductor chip 20 is bonded in the recessed cavity 221. The bonding is accomplished by coating silver epoxy 28 on the designated surface of the heat sink plate 22, then performing alignment and positioning by means of a CCD camera to bond the semiconductor chip 20 firmly onto the silver epoxy 28. Finally secure the bonding through a thermal curing process. The heat sink plate 22 is made from a metal or semi-metallic meterials such as a copper alloy, a molebdenum alloy or a tungsten copper alloy, and is formed by stamping. The Coefficient of Thermal Expansion (CTE) of the heat sink plate 22 is chosed to be close to that of the dielectric layer 24 to prevent the flip chip package module from warpping, bending or crack when the temperature changes. The CTE is preferably between 4 ppm/° C. and 18 ppm/° C. In addition, in order to enhance thermal dissipation efficiency, thermal conduction coefficient of the heat sink plate 22 is preferably greater than 100 W/m×K.

The dielectric layer 24 is an insulating dielectric material formed on the surface of the radiaiton plate by coating or deposition. The semiconductor chip 20 also is encased therein during the deposition. The material of the dielectric layer 24 may be selected from epoxy compounds, polyimide compounds, or other organic compounds, or inorganic compounds such as silicon oxide or aluminum oxide, etc. Moreover, it also may be from composite layers formed by different above-mentioned materials . In the event of selecting the organic compounds for the dielectric layer 24, a curing process must be performed after the coating or deposition process. The dielectric layer 24 thus formed might have uneven surface resulting from the height of the semiconductor chip 20. After the dielectric layer 24 is coated or deposited, a CMP process must be performed on the dielectric layer 24 surface to produce a total planarized surface.

For forming the vias 21 after dielectric planarization, first, produce a plurality of via holes on the surface of the dielectric layer 24 by laser drilling or dry etching before depositing the metal interconnect layer 26. Each via hole touches one die pad 201 located on the positive side of the semiconductor chip 20. The laser drilling or dry etching process will also remove the thin oxidized layer on top of the die pads 201. During laser drilling or dry etching, an alignment process can be done by a CCD camera if the dielectric layer 24 is translucent. On the other hand, if the dielectric layer 24 is opaque, an alignment process performed by an X-ray camera will be executed.

After the via holes are formed, deposit a metal interconnect layer 26 on the surface of the dielectric layer 24. In the mean time, the via holes will be filled with metal and form a plurality of vias 21 during the the above-mentioned metal deposition process for the metal interconnect layer 26.

The metal interconnect layer 26 becomes a plurality of metal conductive wires after photo lithographic and etching processes. Every metal conductive wire connects to one die pad 201 of the semiconductor chip 20 through a via 21. In addition, every metal conductive wire connects to a pad 261 for a solder ball or enabling a test probe card to perform electric test for the semiconductor chip 20. In order to protect the metal conductive wires of the metal interconnect layer 26, its surface is covered by an insulating layer of solder mask 23. This solder mask is for protecting the metal conductive wires and has opening holes on surrounding the pads 261.

Figure 3:
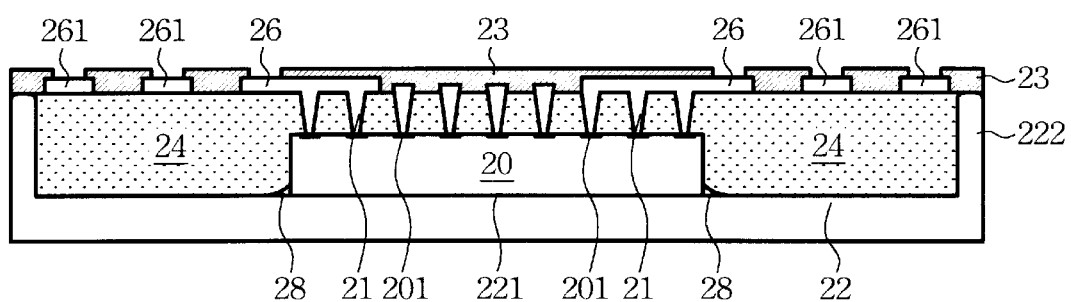
FIG. 3 schematically illustrates the cross-sectional diagram of the flip chip package module in accordance with the second embodiment of the present invention.

Please refer to FIG. 3, which schematically illustrates the cross-sectional diagram of the flip chip package module in accordance with the second embodiment of the present invention. Compared with the first embodiment set forth above, the inner surface of the heat sink plate 22 of this embodiment does not have a recessed cavity. The semiconductor chip 20 is directly mounted onto the heat sink plate 22. All other components and connecting relationships are substantially the same as the first embodiment, thus relevant details are omitted here.

Figure 4:
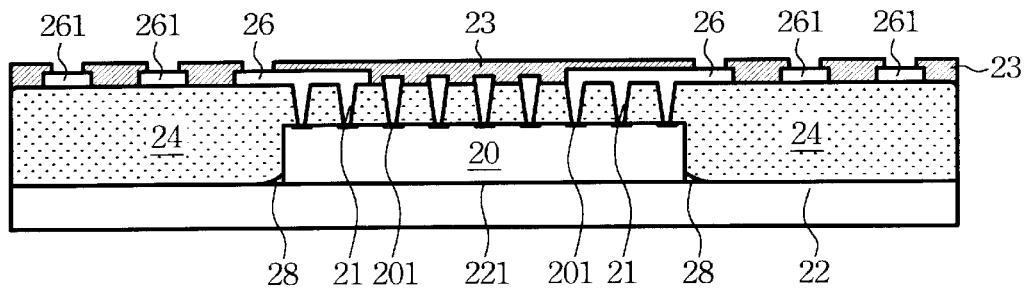
FIG. 4 schematically illustrates the cross-sectional diagram of the flip chip package module in accordance with the third embodiment of the present invention.

Please refer to FIG. 4, which schematically illustrates the cross-sectional diagram of the flip chip package module in accordance with the third embodiment of the present invention. Compared with the first embodiment, the surface of the heat sink plate 22 of this embodiment does not have a recessed cavity or side walls on the borders thereof. The semiconductor chip 20 is directly mounted onto the heat sink plate 22. All other components and connecting relationships are substantially the same as the first embodiment, thus relevant details are omitted here.

Figure 5:
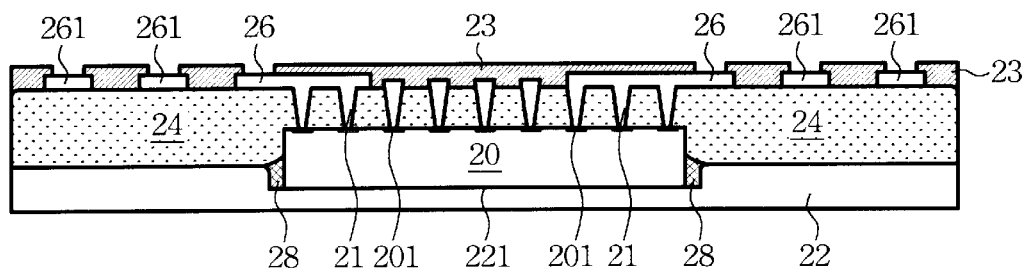
FIG. 5 schematically illustrates the cross-sectional diagram of the flip chip package module in accordance with the fourth embodiment of the present invention.

Please refer to FIG. 5, which schematically illustrates the cross-sectional diagram of the flip chip package module in accordance with the fourth embodiment of the present invention. Compared with the first embodiment, the heat sink plate 22 of this embodiment does not have side walls on the borders thereof and the inner surface of the heat sink plate 22 has a recessed cavity. The semiconductor chip 20 is directly mounted onto the cavity area of the heat sink plate 22. All other components and connecting relationships are substantially the same as the first embodiment, thus relevant details are omitted here.

Figure 6:
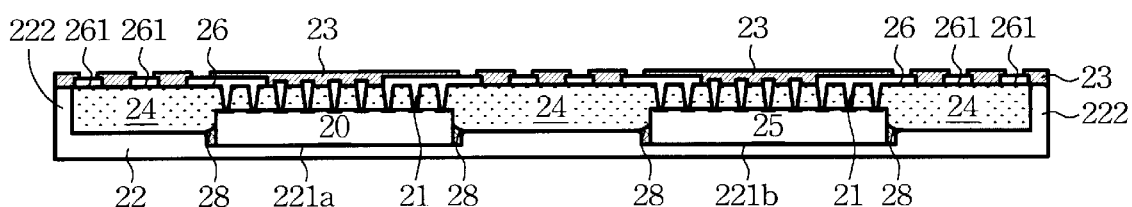
FIG. 6 schematically illustrates the cross-sectional diagram of the flip chip package module in accordance with the fifth embodiment of the present invention.

Please refer to FIG. 6, which schematically illustrates the cross-sectional diagram of the flip chip package module in accordance with the fifth embodiment of the present invention. This embodiment adds a plurality of embedded components 25 nearby the semiconductor chip 20. The embedded components 25 are a semiconductor chip formed in a multi-chip module (MCM) and may adopt any of the flip chip package modules set forth in the first embodiment through the fourth embodiment. To facilitate explanation, this embodiment adopts the first embodiment to process the MCM flip chip packaging. As shown in the figure, the inner surface of the heat sink plate 22 has two recessed cavities 221a and 221b. The semiconductor chip 20 and the embedded components 25 (semiconductor chip) are mounted respectively onto the recessed cavities 221a and 221b. Then the above-mentioned packaging processes are applied to complete the MCM flip chip package module of this embodiment.

Figure 7:
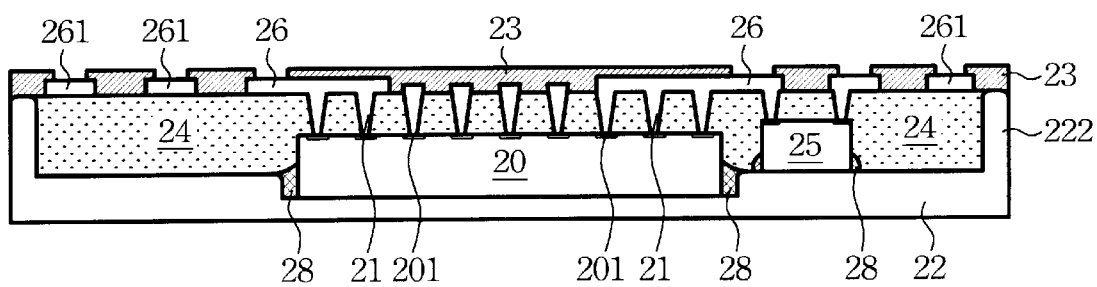
FIG. 7 schematically illustrates the cross-sectional diagram of the flip chip package module in accordance with the sixth embodiment of the present invention.

Please refer to FIG. 7, which schematically illustrates the cross-sectional diagram of the flip chip package module in accordance with the sixth embodiment of the present invention. Compared with the fifth embodiment shown in FIG. 6, the embedded components 25 nearby the semiconductor chip 20 in this embodiment are passive components. And the semiconductor chip 20 and the passive components are integrated into the same package module to enhance operation performance.

Referring now to FIG. 8A to FIG. 8H, schematic diagrams of the method of forming a flip chip package module according to the present invention are disclosed.

Figure 8A:
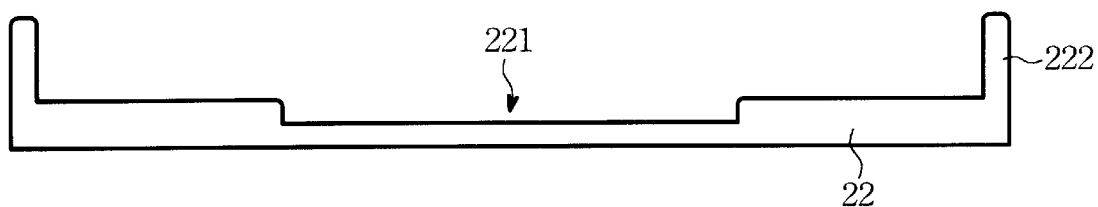
FIG. 8A to FIG. 8H are schematic diagrams of the method of forming a flip chip package module according to the present invention.
Figure 8B:
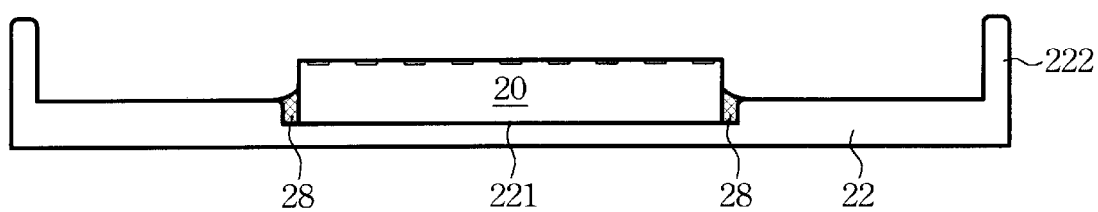
Figure 8C:
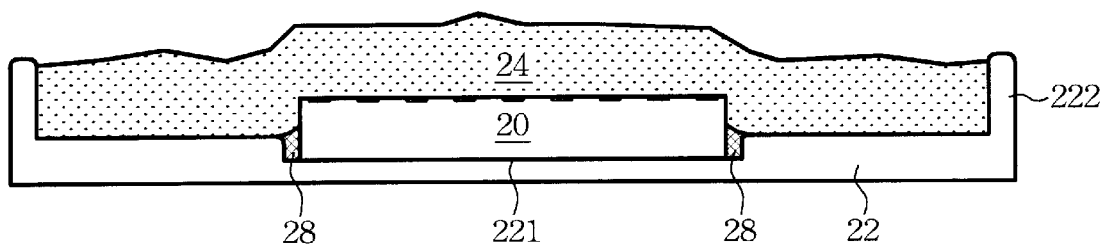
Figure 8D:
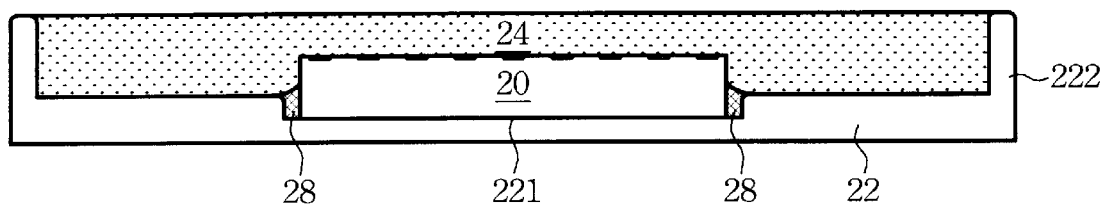
Figure 8E:
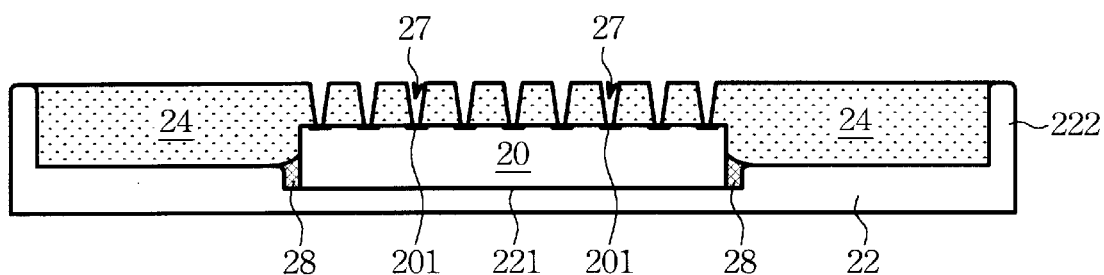
Figure 8F:
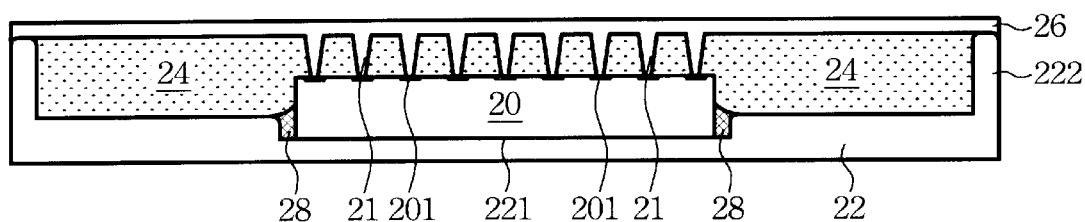
Figure 8G:
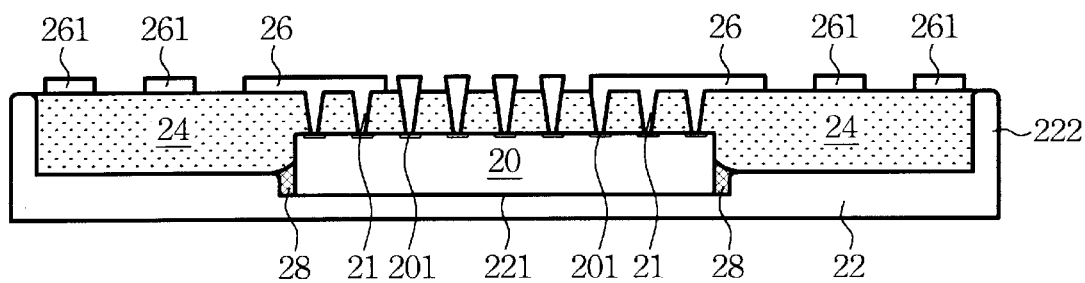
Figure 8H:
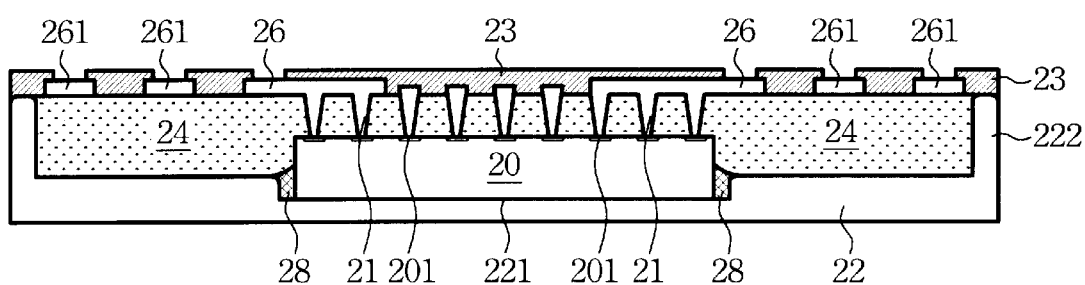

As shown in FIG. 8A, first, a heat sink plate 22 is provided. The heat sink plate 22 may adopt any design shown from FIG. 2 to FIG. 6. Then bond the back side of at least one semiconductor chip 20 onto the heat sink plate 22 (referring to FIG. 8B). As shown in the figure, the semiconductor chip 20 is mounted onto a recessed cavity 221 of the heat sink plate 22 by the bonding method set forth above. The bonding material can be silver epoxy 28. Then deposit a dielectric layer (or composite dielectric layers) 24 on the inner surface of the heat sink plate 22 and encase the semiconductor chip 20 therein (referring to FIG. 8C). Employ a CMP process to polish and planarize the entire surface of the dielectric layer 24 (referring to FIG. 8D). Then form a plurality of via holes 27 on the surface of the dielectric layer 24 by laser drilling or dry etching (referring to FIG. 8E), with every via hole 27 touches and slightly penetrates into a die pad 201 surface on the positive side of the semiconductor chip 20. Next, deposit a metal interconnect layer 26 on the surface of the dielectric layer 24 and in the mean time fill every via hole 27 to form a plurality of vias 21 (referring to FIG. 8F). Then form a plurality of metal conductive wires and a plurality of pads 261 on the surface of the metal interconnect layer 26 through photo lithographic and etching processes (referring to FIG. 8G). Finally cover a layer of insulating solder mask 23 on the surface of the metal conductive wires for protection and form an opening hole surroundingeach pads 261 (referring to FIG. 8H).

In summary, compared with the conventional techniques, the flip chip package module and the method of forming the same according to the present invention has the following advantages:

1. The present invention has vias to directly connect the metal conuctive wires of the metal interconnect layer to the die pads of the semiconductor chip, thus the use of costly bumping process (forming UBM (Under Bump Metallurgy) and bumps) is eliminated and the high cost for such process is saved.

2. The use of costly multi-layer substrate (such as four or six layers of metal interconnect layer) is eliminated according to the present invention, thus can also save the package cost.

3. No bumps are required on the semiconductor chip, hence the use of expensive probe cards for chip probe is eliminated. Therefore the cost of chip probe test can be reduced.

4. The metal heat sink plate has electromagnetic shielding effect and can prevent the semiconductor chip from being damaged by electrical static discharge. Moreover, it can enhance thermal dissipation and fend off moisture.

5. The present invention may be adopted for packaging multi-chip modules for semicondutor chips of different thickness. Bonding of the multiple semiconductor chips onto a single heat sink plate 22 is much easier and thermal dissipation can be improved.

6. The package module made according to the invention can befabricated with two flat and parallel surfaces (pad 261 side and heat sink plate 22 outer surface) easily.

7. The conventional PCB (printed circuit board) build-up process can be applied to the present invention to form the build-up layer(s) on the surface of the first inteconnect layer (before solder mask layer formation) and thus form a multi-layer interconnect semiconductor package module.

8. The LGA (land grid array) package form disclosed in the present invention can be easily converted to PGA (pin grid array), CGA (column grid array) or BGA (ball grid array) package forms by futher processes.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A flip chip package module, comprising:
    a semiconductor chip having a first side with circuits and a plurality of die pads located thereon and a second side;
    a heat sink plate held said semiconductor chip by bonding onto said second side;
    a dielectric layer being deposited on the inner surface of said heat sink plate and encasing said semiconductor chip therein; and
    a metal interconnect layer located on the surface of said dielectric layer including a plurality of metal conductive wires, each of said metal conductive wires being connected to one of said die pads of said semiconductor chip through a via.

2. The flip chip package module of claim 1, wherein said heat sink plate is made from one of metal and semi-metal materials and has a recessed cavity formed on said inner surface thereof for bonding to said second side of said semiconductor chip.

3. The flip chip package module of claim 1, wherein said semiconductor chip is bonded onto said heat sink plate by conductive epoxy.

4. The flip chip package module of claim 1, wherein said dielectric layer is made from an insulating material which has a coefficient of thermal expansion proximate to that of said heat sink plate.

5. The flip chip package module of claim 1, wherein said dielectric layer is a composite layer consisting of multiple layers formed by different dielectric materials and has a coefficient of thermal expansion proximate to that of said heat sink plate.

6. The flip chip package module of claim 1, wherein said dielectric layer is polished by a CMP process after dielectric deposition to obtain a total flatness.

7. The flip chip package module of claim 1, wherein each of said metal conductive wires of said metal interconnect layer being connected to a pad, said pad being connected to a solder ball.

8. The flip chip package module of claim 1, wherein each of said metal conductive wires of said metal interconnect layer being connected to a pad, said pad being connected to a probe card to perform chip probe tests for said semiconductor chip.

9. The flip chip package module of claim 7, wherein said metal interconnect layer is covered by an insulating solder mask to protect said metal conductive wires of said metal interconnect layer, and has an opening hole formed surrounding said pad.

10. The flip chip package module of claim 1, wherein said heat sink plate has at least one embedded component adjacent to said semiconductor chip, and said dielectric layer encases said embedded component during deposition.

11. The flip chip package module of claim 10, wherein said embedded component is passive component.

12.The flip chip package module of claim 10, wherein said embedded component is another semiconductor chip such that said flip chip lackage module becomes a multi-chip module (MCM).

13. A method of forming a flip chip package module, comprising:

proviiding a heat sink plate;

bonding a second side of at least one semiconductor chip onto said heat sink plate, said semiconductor chip having a first side which has circuits and a plurality of die pads located thereon;

depositing a dielectric layer on the inner surface of said heat sink plate and encasing said semiconductor chip therein;

forming a plurality of via holes on the surface of said dielectric layer, each of said via holes touches one of said die pads on said first side of said semiconductor chip;

forming a metal interconnect layer on the surface of said dielectric layer and during the same processing filling said via holes to form a plurality of vias; and forming a plurality of conductive wires and a plurality of pads on the surface of said metal interconnect layer through photo lithographic and etching processes.

14. The method of claim 13, wherein said heat sink plate is made from one of metal and semi-metal materials and has a recessed cavity formed on said inner surface thereof for bonding to said second side of said semiconductor chip.

15. The method of claim 13, wherein said semiconductor chip is bonded onto said heat sink plate by conductive epoxy.

16. The method of claim 13, wherein said dielectric layer is polished by a CMP process after dielectric deposition to obtain an total flatness.

17. The method of claim 13, wherein said dielectric layer is made from an insulating material which has a coefficient of thermal expansion proximate to that of said heat sink plate.

18. The method of claim 13, wherein said dielectric layer is a composite layer consisting of multiple layers formed by different dielectric materials and has a coefficient of thermal expansion proximate to that of said heat sink plate.

19. The method of claim 13, wherein said pad of each of said conductive wires is connected to a solder ball.

20. The method of claim 13, wherein said pad of each of said conductive wires is connected to a probe card to perform chip probe tests for said semiconductor chip.

21. The method of claim 20, wherein said metal interconnect layer is covered by an insulating solder mask to protect said metal conductive wires of said metal interconnect layer, and has an opening hole surrounding said pad.

22. The method of claim 13, wherein the surface of said metal interconnect layer has at least one build-up layer formed thereon through a PCB build-up process to form a multi-layer interconnect semiconductor package module.

23. The method of claim 13, wherein said via holes of said dielectric layer are selectively formed by one of laser drilling and dry etching.

24. The method of claim 13, wherein said dielectric layer is translucent, and a CCD camera being used for alignment while forming said via holes.

25. The method of claim 13, wherein said dielectric layer is opaque, and a X-ray camera being used for alignment while forming said via holes.

* * * * *